(12) United States Patent
Jung et al.

(10) Patent No.: US 7,745,072 B2
(45) Date of Patent: Jun. 29, 2010

(54) METHOD OF CORRECTING CRITICAL DIMENSION IN PHOTOMASK AND PHOTOMASK HAVING CORRECTED CRITICAL DIMENSION USING THE METHOD

(75) Inventors: Jin-sik Jung, Seoul (KR); Hee-bom Kim, Suwon-si (KR); Hoon Kim, Siheung-si (KR); Sung-min Huh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 314 days.

(21) Appl. No.: 11/808,588

(22) Filed: Jun. 12, 2007

(65) Prior Publication Data

US 2008/0044742 A1 Feb. 21, 2008

Related U.S. Application Data

(63) Continuation-in-part of application No. 11/446,980, filed on Jun. 6, 2006.

(30) Foreign Application Priority Data

Jun. 12, 2006 (KR) ...................... 10-2006-0052591

(51) Int. Cl.
G03F 1/00 (2006.01)
G03F 1/14 (2006.01)
(52) U.S. Cl. ............................. 430/5; 216/12
(58) Field of Classification Search ...................... 430/5, 430/30; 216/12
See application file for complete search history.

(56) References Cited

U.S. PATENT DOCUMENTS

| | | | |
|---|---|---|---|
| 4,537,813 A | * | 8/1985 | Kuyel .............................. 430/5 |
| 5,290,647 A | * | 3/1994 | Miyazaki et al. ................ 430/5 |
| 5,298,351 A | | 3/1994 | Bobroff et al. |
| 5,380,608 A | | 1/1995 | Miyashita et al. |
| 5,561,010 A | * | 10/1996 | Hanyu et al. ..................... 430/5 |
| 5,563,009 A | | 10/1996 | Bae |
| 5,786,113 A | | 7/1998 | Hashimoto et al. |

(Continued)

FOREIGN PATENT DOCUMENTS

JP 58-207048 12/1983

(Continued)

OTHER PUBLICATIONS

Korean Intellectual Property Office Notice to Submit Response dated Aug. 31, 2006 and English Translation.

(Continued)

*Primary Examiner*—Mark F Huff
*Assistant Examiner*—John Ruggles
(74) *Attorney, Agent, or Firm*—Harness, Dickey & Pierce, P.L.C.

(57) ABSTRACT

Provided are a method of correcting a critical dimension (CD) in a photomask and a photomask having a corrected CD using the method. The method may include providing a substrate that is transparent with respect to an incident light, forming shielding patterns on the substrate to form a photomask, detecting a CD error region of the shielding patterns, and forming a correction film to vary an intensity of the incident light in the CD error region to correct critical dimensions (CDs) of circuit patterns formed by the shielding patterns.

24 Claims, 10 Drawing Sheets

U.S. PATENT DOCUMENTS

| | | | |
|---|---|---|---|
| 6,338,921 B1 * | 1/2002 | Bruce et al. | 430/5 |
| 2002/0122995 A1 * | 9/2002 | Mancini et al. | 430/5 |
| 2003/0157415 A1 * | 8/2003 | Ziger | 430/5 |

FOREIGN PATENT DOCUMENTS

| | | |
|---|---|---|
| JP | 07-134392 | 5/1995 |
| JP | 2005-055815 | 3/2005 |
| KR | 1020000001790 A | 1/2000 |
| KR | 1020010002127 A | 1/2001 |
| KR | 1020020052740 A | 7/2002 |
| KR | 1020030056499 A | 7/2003 |
| KR | 1020040008472 A | 1/2004 |

OTHER PUBLICATIONS

Office Action dated Apr. 14, 2010, issued in corresponding Chinese Patent Application No. 200610129040.1.

* cited by examiner

METHOD OF CORRECTING CRITICAL DIMENSION IN PHOTOMASK AND PHOTOMASK HAVING CORRECTED CRITICAL DIMENSION USING THE METHOD

CROSS-REFERENCE TO RELATED PATENT APPLICATIONS

This application is a continuation-in-part of U.S. application Ser. No. 11/446,980 filed on Jun. 6, 2006, and claims the benefit of priority under 35 U.S.C. §120 to U.S. application Ser. No. 11/446,980. The entire contents of U.S. application Ser. No. 11/446,980 is incorporated herein by reference.

PRIORITY STATEMENT

This application claims the benefit of priority under 35 U.S.C. §119 to Korean Patent Application No. 10-2006-0052591, filed on Jun. 12, 2006, in the Korean Intellectual Property Office. The entire contents of Korean Patent Application No. 10-2006-0052591 is incorporated herein by reference.

BACKGROUND OF THE INVENTION

1. Field of the Invention

Example embodiments relate to a photolithography technique. More particularly, example embodiments relate to a method of correcting a critical dimension (CD) in a photomask and a photomask having a CD corrected using the method.

2. Description of the Related Art

Generally, a photomask refers to a high-precision plate used to form an integrated circuit (IC) on a wafer. Such a photomask may include a transparent substrate and a shielding pattern formed on one surface of the transparent substrate. Generally, the shielding pattern in the photomask defines a circuit pattern. For example, the shielding pattern may be a photoresist pattern used to form a circuit pattern on a substrate. Theoretically, a critical dimension (CD) of the shielding pattern of the photomask and a CD of the corresponding circuit pattern formed on the wafer should be identical to each other. However, for reasons including space distribution defects of an exposure source, defects of exposure equipment such as lens defects, errors of the shielding pattern of the photomask, etc.; the CD of the shielding pattern and the CD of the circuit pattern may be different from each other.

Conventionally, correcting a CD of a photomask may include a method of etching a transparent substrate adjacent to a shielding pattern of the photomask by a desired and/or predetermined depth or a method of forming a diffraction grating on a rear surface of a transparent substrate in which a shielding pattern is not formed.

However, both the conventional method of etching the transparent substrate and the conventional method of forming the diffraction grating require etching a substrate in a photomask by a desired and/or predetermined depth, so as to precisely correct CDs of shielding patterns. Conventional techniques for precisely etching the substrate may be difficult, costly and/or lead to defects.

SUMMARY

Example embodiments provide a method of correcting a critical dimension (CD) in a photomask by which a critical dimension (CD) of a shielding pattern can be precisely corrected by a relatively simple process.

Example embodiments also provide a photomask obtained by the method of correcting the CD in the photomask.

According to an example embodiment, there is provided a method of correcting a critical dimension (CD) in a photomask. The method may include providing a substrate that is transparent with respect to an incident light; forming a plurality of shielding patterns on the substrate to form a photomask; detecting a CD error region of the shielding patterns; and forming a correction film to vary an intensity of the incident light in the CD error region to correct critical dimensions (CDs) of circuit patterns formed by the shielding patterns. Further, the method may include adjusting a thickness of the correction film in the CD error region. The forming the plurality of shielding patterns and the forming the correction film may be sequentially performed to form a photomask stack including a shielding film, a correction film, and a dummy shielding film on the transparent substrate.

According to an example embodiment, there is provided a method of correcting a critical dimension (CD) in a photomask. A substrate transparent with respect to an incident light is prepared. A plurality of shielding patterns are formed on the substrate to form a photomask and then, a critical dimension (CD) error region of the shielding patterns of the photomask is detected. A correction film to vary an intensity of the incident light is formed in the CD error region to correct critical dimensions (CD) of circuit patterns formed from the shielding patterns of the CD error region.

According to another example embodiment, there is provided a method of correcting a critical dimension (CD) in a photomask. A substrate transparent with respect to an incident light is provided. A plurality of shielding patterns on the substrate and a correction film that is transparent with respect to the incident light are sequentially formed to form a photomask. A critical dimension (CD) error region of the shielding patterns of the photomask is detected, and a thickness of the correction film in a region of the shielding patterns in which a CD error occurs is adjusted.

According to an example embodiment, in order to increase CDs of circuit patterns on a wafer, which correspond to the CD error region of the photomask, an additional correction film may be further formed on the correction film in the CD error region. Conversely, in order to decrease CDs of circuit patterns on a wafer corresponding to the CD error region, a correction film in the CD error region may be etched by a desired and/or predetermined amount to achieve a desired thickness.

According to still another example embodiment, there is provided a photomask. The photomask may include a substrate that is transparent with respect to an incident light; a plurality of shielding patterns formed on the substrate; and a correction film that is transparent with respect to the incident light formed on the shielding patterns, wherein a thickness of the correction film in a normal critical dimension (CD) region and a thickness of the correction film in a CD error region are different from each other.

According to still another example embodiment, there is provided a photomask. The photomask may include a substrate that is transparent with respect to an incident light; a plurality of shielding patterns formed on the substrate; and a correction film formed on a critical dimension (CD) error region of the shielding patterns.

BRIEF DESCRIPTION OF THE DRAWINGS

The above and other features, aspects, and advantages of example embodiments will become more apparent from a review of the detailed description that refers example embodiments illustrated in the attached drawings, in which.

DETAILED DESCRIPTION OF EXAMPLE EMBODIMENTS

Example embodiments are described below more fully with reference to the accompanying drawings, in which example embodiments are shown. Advantages and features of the example embodiments and associated methods are also described with reference to the accompanying drawings. The example embodiments described below should not be construed as limiting and are provided so that this disclosure will be thorough and complete.

In the drawings, the thicknesses of layers and regions may be exaggerated for clarity. Further, like numbers refer to like elements throughout the description of the drawings. Specific structural and functional details disclosed herein are merely representative for purposes of describing example embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the drawings. For example, two drawings shown in succession may in fact be executed substantially concurrently or may sometimes be executed in the reverse order, depending upon the functionality/acts involved.

In the drawings, if a layer is formed on another layer or a substrate, it means that the layer is directly formed on another layer or a substrate, or that a third layer is interposed therebetween. Although example embodiments are disclosed for illustrative purposes, those skilled in the art will appreciate that various modifications, additions and substitutions are possible, without departing from the scope and spirit of this disclosure.

An example embodiment of a photomask may have a normal critical dimension (CD) region and a CD error region. The photomask may be used to create circuit patterns on a wafer. The CD error region of the photomask corresponds to a region of the wafer in which there are errors in the CDs of the circuit patterns formed on the wafer.

In the example embodiments described below, a correction film for varying an intensity of an incident light is formed in a photomask. The correction film may be formed in the CD error region of the photomask so that CDs of circuit patterns on the wafer, which correspond to shielding patterns in the CD error region of the photomask, can be corrected. A film that is transparent with respect to an incident light may be used as the correction film. In addition, the CD of the circuit patterns may be controlled by the thickness of the correction film. Since the correction film can be formed by performing one or more of the relatively simple processes of depositing and/or depositing/patterning, the relatively complicated process of etching a substrate is not be needed according to one or more of the example embodiments described below.

Figure 1:
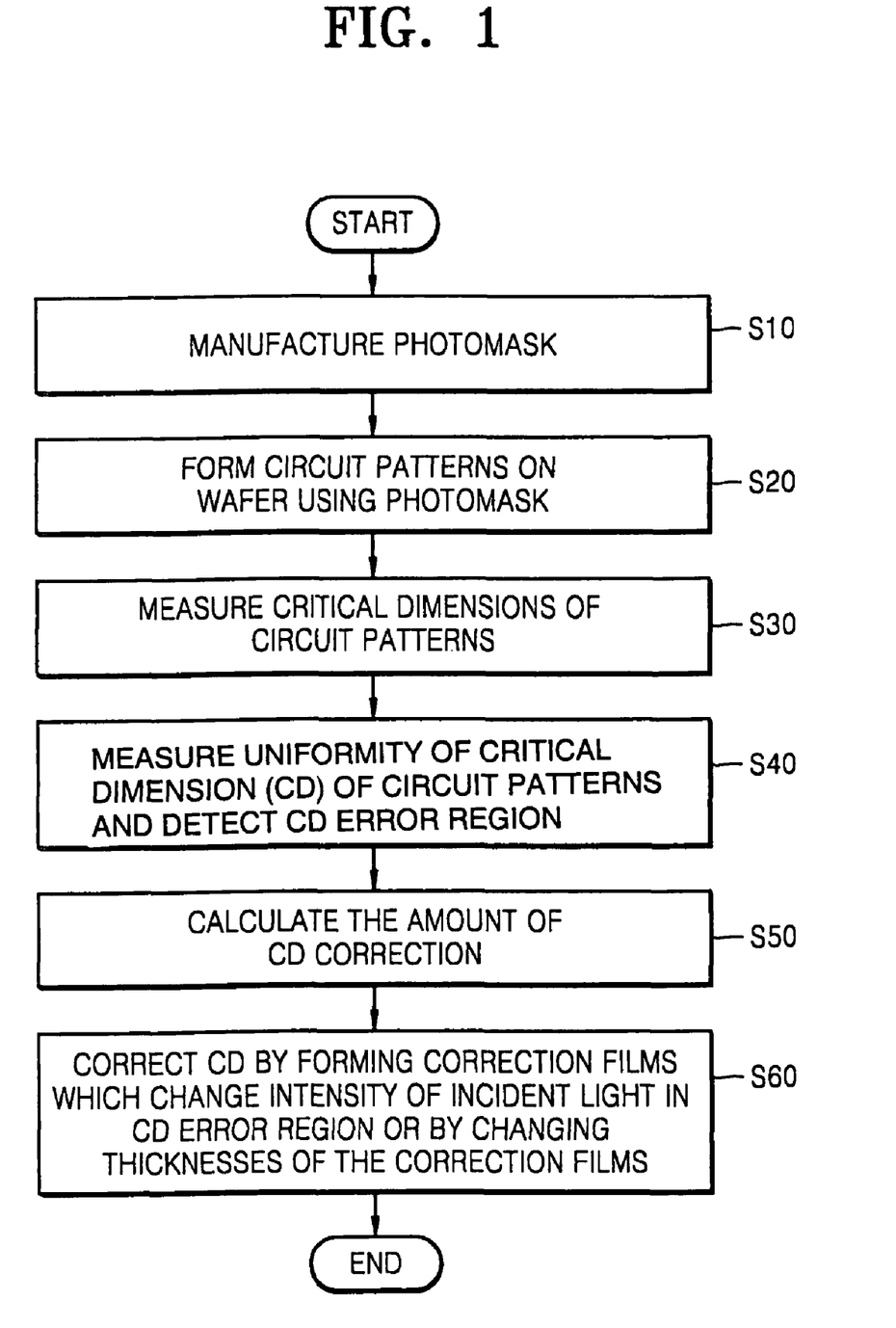
FIG. 1 is a flowchart illustrating an example embodiment of a method of correcting a critical dimension (CD) in a photomask.

An example embodiment of a method of correcting a CD in a photomask is described in greater detail with reference to FIG. 1. Referring to FIG. 1, firstly, a photomask is manufactured (operation S10). The photomask may include a substrate that is transparent with respect to incident light and shielding patterns formed on one surface of the substrate. In addition, correction films having substantially uniform thicknesses may be formed on the shielding patterns. For example, the correction films may be formed on only the CD error region of the photomask or on both the CD error region of the photomask and the normal CD region of the photomask.

Circuit patterns, for example, photoresist patterns for forming the circuit patterns, are formed on a wafer using the photomask (operation S20). The photoresist patterns may be formed by a photolithography process, which may include coating, exposing and developing, for example.

Subsequently, critical dimensions (CDs) of the circuit patterns formed on the wafer are measured (operation S30). For example, the CDs of the photoresist patterns may be measured using a scanning electron microscope (SEM) technique or an optical critical dimension (OCD) technique. The SEM technique is a technique in which CDs of the photoresist patterns are measured by directly irradiating electron beams onto the photoresist patterns and capturing secondary electrons emitted from the surface of the wafer on which the photoresist patterns are formed. The OCD technique is a technique in which CDs of the photoresist patterns are measured by capturing light reflected from the photoresist patterns. Measuring of the CDs of the circuit patterns may be randomly performed on one or more of the circuit patterns. Alternatively, the CDs of all of the circuit patterns may be measured.

The uniformity of the CDs of the circuit patterns are measured based on the measured circuit-pattern CD and a CD error region which deviates from the CD uniformity is detected (operation S40). For example, after the CD of the circuit patterns in each region of the wafer are measured, the respective CDs of each region are compared. In this example, a region of the wafer which deviates from an average of a plurality of CDs is determined as a CD error region of the wafer. There may be an allowable error range and any CDs determined to be outside of the error range are identified as CD error regions of the wafer. Each CD error region of the wafer has a corresponding CD error region of the photomask. Stated differently, a region of the photomask, which is used to create the CD error region of the wafer, is referred to as the CD error region of the photomask. Further, all of the determined CD error regions of the wafer are collectively referred to herein as the CD error region of the wafer, and all of the CD error regions of the photomask, which correspond to the CD error regions of the wafer, are collectively referred to hereinafter as the CD error region of the photomask.

Next, the amount of correction may be calculated from a difference between an average of the CDs of the circuit patterns in the CD error region of the wafer and an average of the CDs of all of the circuit patterns formed on the wafer (operation S50).

The CDs of the shielding patterns of the photomask are then corrected by forming correction films on the shielding patterns so the intensity of the incident light in the CD error region of the wafer may be adjusted. Alternatively, the CDs of the shielding patterns of the photomasks may be corrected by changing the thicknesses of the correction films previously formed on the shielding patterns based on the calculated amount of correction (operation S60).

An example embodiment, in which the CDs of the circuit patterns on the wafer are corrected by forming the correction films on the photomask, is described with reference to FIGS. 2A and 2B.

Figure 2A:
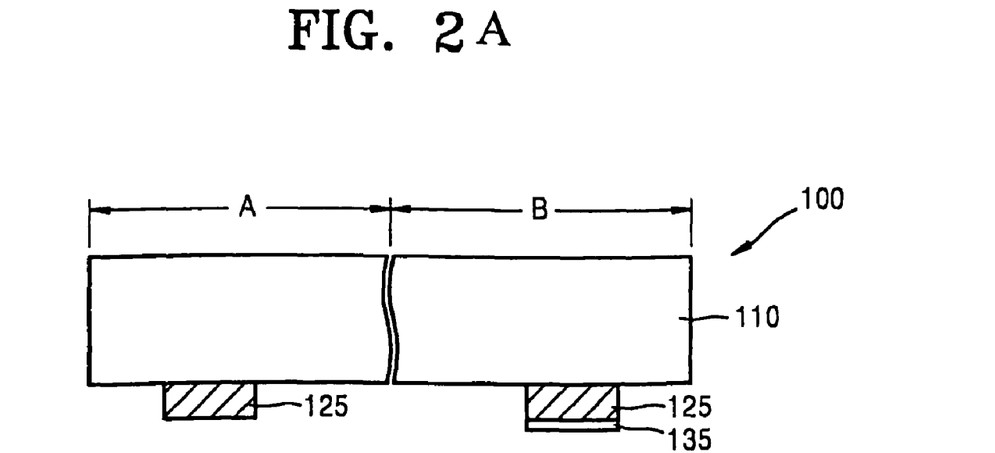
FIGS. 2A and 2B illustrate effects of correcting a CD in a photomask using the method illustrated in FIG. 1.

Referring to FIG. 2A, a photomask 100 includes a transparent substrate 110 and a plurality of shielding patterns 125 for defining circuit patterns on the wafer. "A" of FIG. 2A denotes a normal CD region of the photomask, which is determined by measuring and analyzing the CDs of the circuit patterns of the wafer, and "B" of FIG. 2A denotes a CD error region of the photomask, which is determined by measuring and analyzing the CDs of circuit patterns on the wafer. According to the example embodiment shown in FIGS. 2A and 2B, in order to correct the CD of the circuit patterns of the wafer corresponding to the CD error region B of the photomask, a correction film 135 is formed on the shielding pattern 125 in the CD error region B of the photomask. The correction film 135 is a film that is transparent with respect to an incident light. For example, the correction film 135 may be a silicon oxide film or a silicon nitride film, which may have a light absorption rate equal to or less than about 0.3.

Figure 2B:
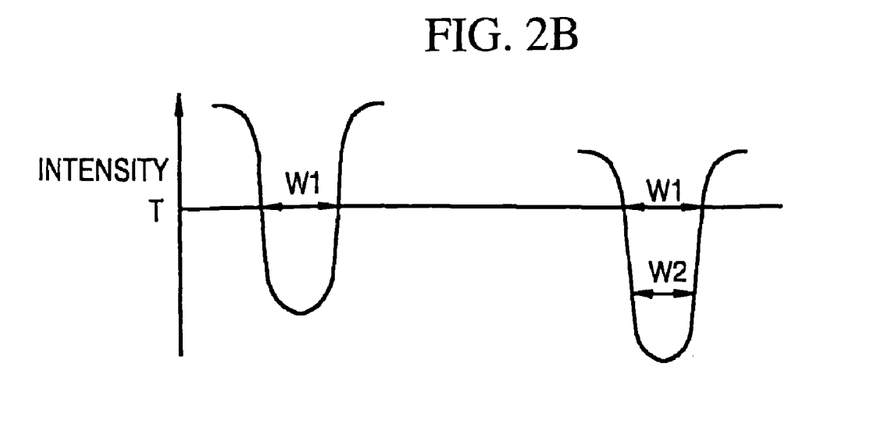

By forming the correction film 135 on the shielding pattern 125 in the CD error region B of the photomask, the intensity of an aerial image, which represents the intensity of the incident light on the substrate is rapidly decreased as shown in FIG. 2B. That is, by forming the transparent correction film 135, the intensity of the incident light is rapidly decreased such that the width of the aerial image corresponding to an exposure threshold value T is increased. As such, CDs of circuit patterns corresponding to the shielding patterns 125 on which correction films and/or patterns are formed may be increased and corrected. "W1" of FIG. 2B denotes a normal CD and "W2" of FIG. 2B denotes an abnormal CD.

In addition, the thickness of the correction film 135 provides a three-dimensional (3D) topology to the surface of the photomask 100. The 3D topology on the photomask causes the phase of the incident light to be modulated such that the intensity of a $0^{th}$-order light of the incident light is decreased and the intensity of a first-order light is increased. As such, an image contrast may also be improved according to an example embodiment.

Figure 3:
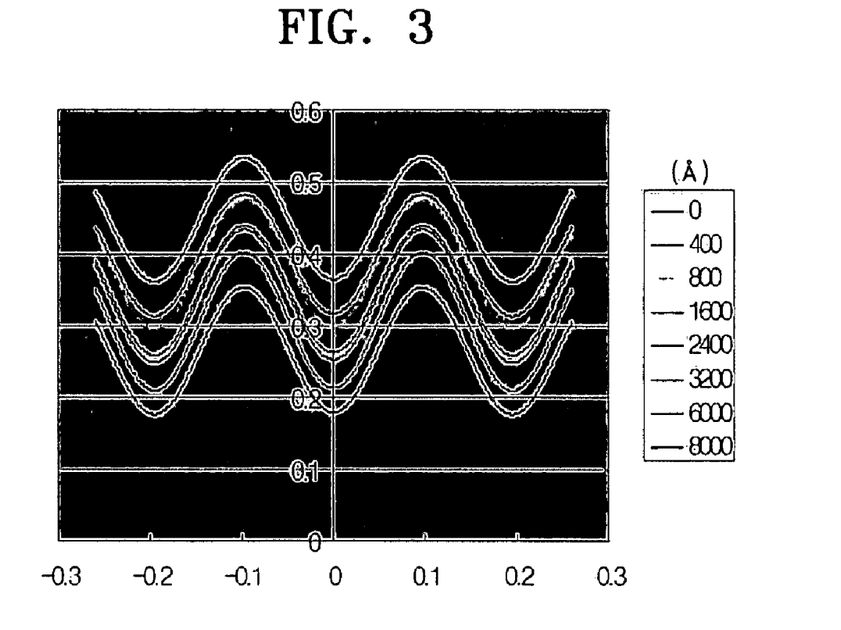
FIG. 3 is a graph of the intensity of the aerial image versus the thickness of the correction patterns.

FIG. 3 is a graph of the intensity of the aerial image versus the thickness of the correction film illustrated in FIG. 2A. Referring to FIG. 3, as the thickness of the correction film increases to 0 Å to 400 Å, 800 Å, 1600 Å, . . . , and 8000 Å, the intensity of the aerial image is gradually decreased. The decrease in the intensity of the aerial image means that amplitude is increased at an exposure threshold value. As such, the thickness of the correction film is increased so that the CD of the circuit patterns can be increased.

Figure 4:
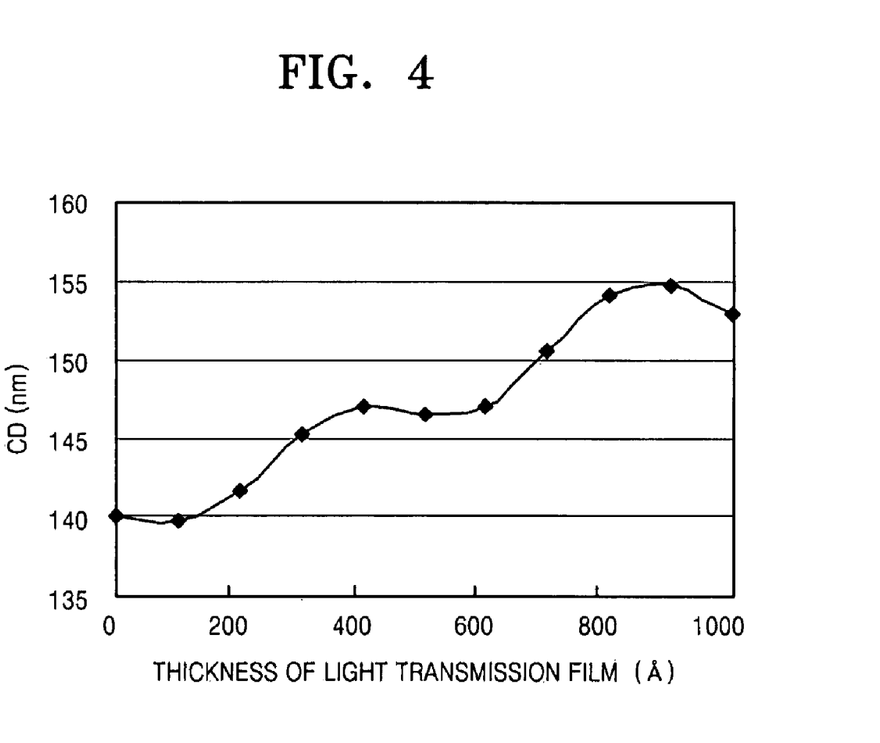
FIG. 4 is a graph of a variation in critical dimensions (CD) versus the thickness of the correction pattern.

FIG. 4 is a graph of a variation in CDs versus the thickness of the correction film illustrated in FIG. 2A. Referring to FIG. 4, as the thickness of the correction film increases, a CD of the corresponding circuit pattern gradually increases. Thus, according to the experiment result shown in FIG. 4, the CD of the corresponding circuit pattern can be precisely controlled by varying the thickness of the correction film.

FIGS. 5A through 5D illustrate another example embodiment in which the photomask 100 includes correction films on all of the shielding patterns 125. In other words, the example embodiment illustrated in FIGS. 5A through 5D is an example embodiment in which correction films on formed on shielding patterns in both the normal CD region A and the CD error region B. According to this example embodiment, the CD of the circuit patterns formed on the wafer, which correspond to the shielding patterns 125 of the photomask, can be increased or decreased by adjusting the thickness of the correction film in the CD error region B.

Figure 5A:
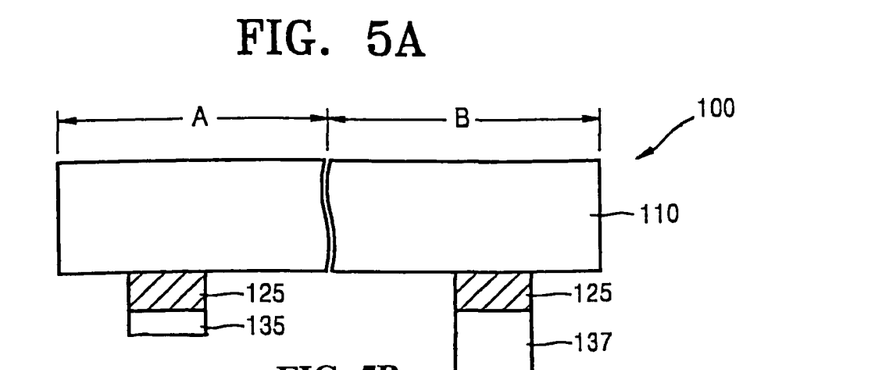
FIGS. 5A and 5B illustrate a technique for increasing critical dimensions (CD) of circuit patterns in a CD error region according to an example embodiment.
Figure 5B:
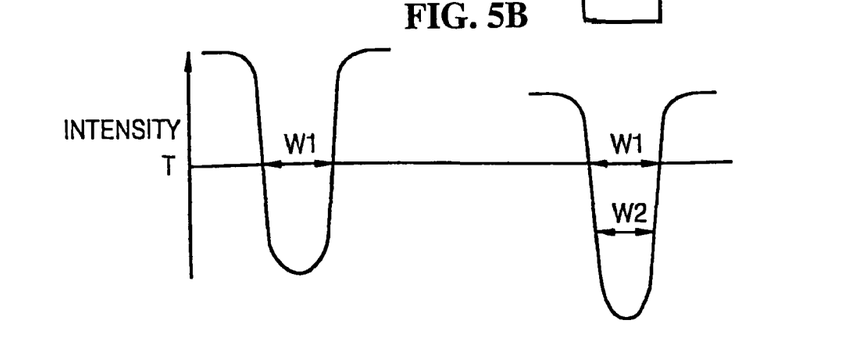
Figure 5C:
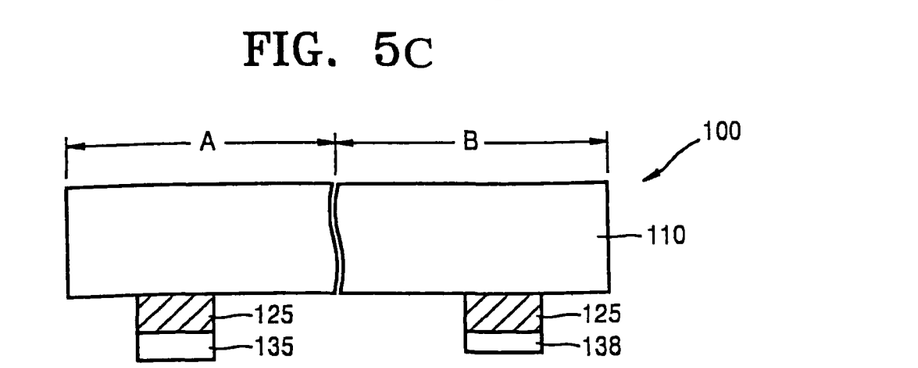
FIGS. 5C and 5D illustrate a technique for decreasing critical dimensions (CD) of circuit patterns in a CD error region illustrated in FIG. 1.

More specifically, each shielding pattern 125 and each correction film 135 are stacked on the substrate 110 in the normal CD region A of the photomask and on the substrate 110 in the CD error region B of the photomask as illustrated in FIGS. 5A and 5C.

As illustrated in FIGS. 5A and 5B, in order to relatively increase the CDs of the circuit patterns corresponding to the CD error region B of the photomask, the thickness of a correction film 137 in the CD error region B of the photomask is increased to be larger than the thickness of the correction film 135 in the normal CD region of the photomask. FIG. 5B illustrates that the intensity of the aerial image in the CD error region B becomes smaller than the intensity of the aerial image in the normal CD region A. As such, the width W1 of the intensity of the aerial image corresponding to the exposure threshold value T in the CD error region B is increased such that the CD of the circuit patterns corresponding to the CD error region B are corrected.

Figure 5D:
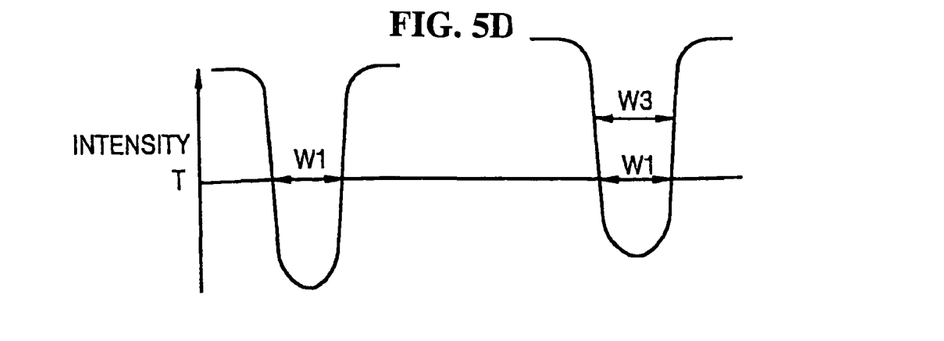

Conversely, as illustrated in FIGS. 5C and D, to decrease the CD of the circuit patterns corresponding to the CD error region B, the thickness of a correction film 138 in the CD error region B is decreased to be smaller than the thickness of the correction film 135 in the normal CD region A. By decreasing the thickness of the correction film 138 in the CD error region B of the wafer, the intensity of the aerial image in the CD error region B is increased at the exposure threshold value so the width W1 of the aerial image at a pattern threshold value T can be decreased and the CD of the circuit patterns can be corrected by a desired and/or predetermined value as illustrated by FIG. 5D. Still referring to FIG. 5D, reference numeral W3 denotes a CD of circuit patterns formed to have a relatively large thickness.

According to an example embodiment, the normal CD region A and the CD error region B may be a cell region and a core/peripheral region, respectively, and may also be specific regions of the respective regions.

Figure 6A:
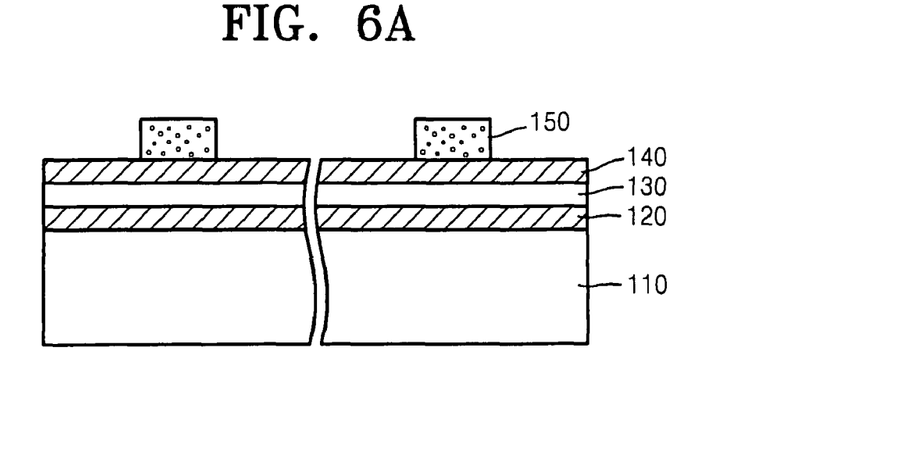
FIGS. 6A through 6F are cross-sectional views illustrating a method of correcting a CD in a photomask according to another example embodiment.

FIGS. 6A through 6F are cross-sectional views illustrating still another method of correcting a CD in a photomask according to an example embodiment. Referring to FIG. 6A, a shielding film 120, a correction film 130 and a dummy shielding film 140 are sequentially stacked on a mask substrate 110. A chrome (Cr) film which intercepts an incident light, for example, may be used as the shielding film 120 and the dummy shielding film 140. In addition, a film that is transparent with respect to the incident light may be used as the correction film 130. Further, the correction film 130 may have a light absorption rate equal to or less than about 0.3 may be used as the correction film. For example, the correction film may be a silicon oxide film or silicon nitride film. According to this example embodiment, the dummy shielding film 130 is a sacrificial layer formed in a dummy shape so that charges are prevented from being charged in a subsequent exposure process. A resist pattern 150 for defining circuit patterns is formed on the dummy shielding film 140 according to this example embodiment.

Figure 6B:
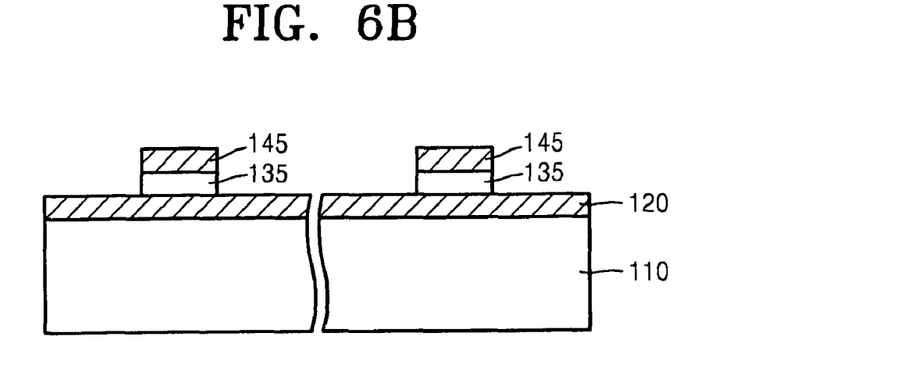

Referring to FIG. 6B, the dummy shielding film 140 and the correction film 130 may be etched in the shape of the resist pattern (see 150 of FIG. 6A), thereby forming a dummy shielding pattern 145 and a correction film 135. The patterned correction film is marked by reference numeral 135 in FIG. 6B.

Figure 6C:
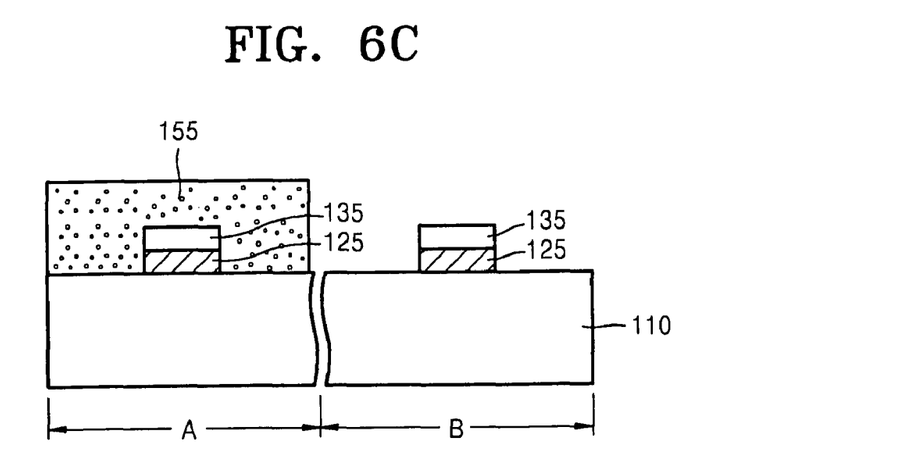

Referring to FIG. 6C, the shielding film 120 may be etched in the shapes of the dummy shielding pattern 145 and the correction film 135, thereby defining a shielding pattern 125. The dummy shielding pattern 145 may be removed using a lift-off technique when an etching process is performed to form the shielding pattern 125, thereby creating a photomask. Next, circuit patterns (photoresist patterns for forming the circuit patterns, not shown) may be formed on a wafer (not shown) using the created photomask. CDs of circuit patterns on the wafer may then be measured and a region in which the CDs of the circuit patterns of the wafer are non-uniform may be identified as a CD error region of the wafer and a region in which the CDs of the circuit patterns are uniform may be identified as a normal CD region. The amount of CD correction is calculated for the CD error region of the wafer. Subsequently, the resist pattern 155 may be formed on the normal CD region denoted in FIG. 6C as "A", and the CD error region B denoted in FIG. 6C may be exposed as shown in FIG. 6C.

Figure 6D:
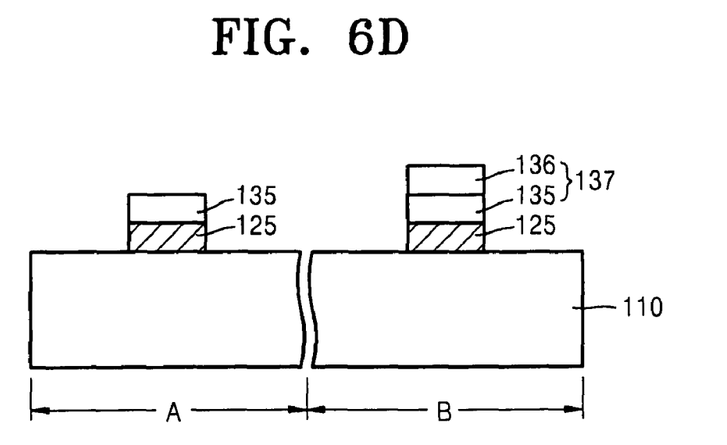
Figure 6E:
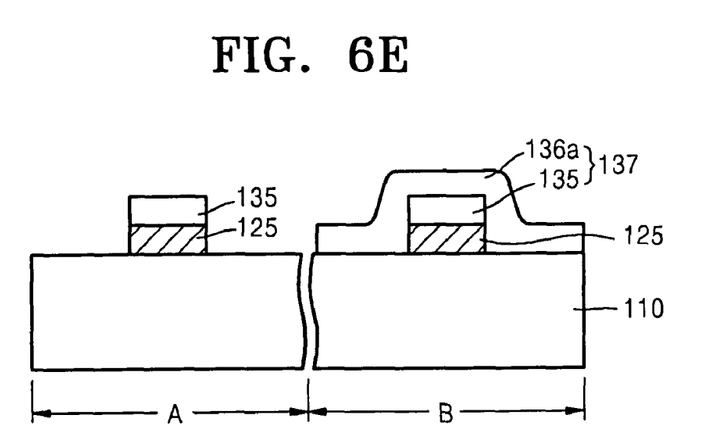

If the CD of the circuit patterns corresponding to the CD error region B of the photomask are smaller than an average of the CDs of all the circuit patterns, as illustrated in FIG. 6D, an additional correction film 136 may be formed on the patterned correction film 135 in the CD error region B of the photomask according to an example embodiment. Alternatively, as illustrated in FIG. 6E, an additional correction film 136a may be formed on the entire surface of the CD error region B of the photomask including the substrate 110 according to an example embodiment. As a result, the thickness of the correction film 137 in the CD error region B of the photomask is increased by the correction films 136 and/or 136a to be larger than the thickness of the correction film 135 in the normal CD region of the photomask such that the CD of the circuit patterns formed from the CD error region B of the photomask may be increased and corrected. For example, the thickness of the correction film 137 may be determined based on the amount of CD correction and the example graph of FIG. 4 showing a variation in CDs versus the thickness of the correction pattern.

Figure 6F:
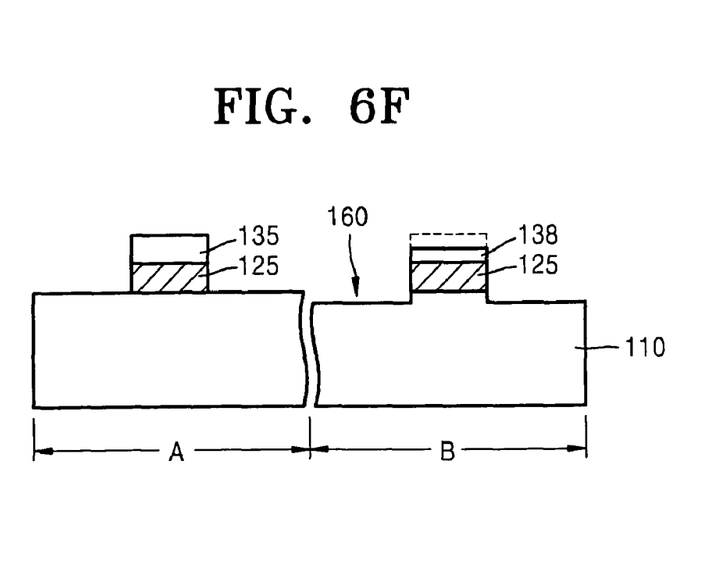

Conversely, if the CDs of the circuit patterns corresponding to the CD error region B of the photomask are measured to be larger than those in other regions of the wafer, as illustrated in FIG. 6F, the thickness of the correction film 138 in the CD error region B of the photomask is reduced according to an example embodiment. For example, a decrease in the thickness of the correction film 138 may be achieved by etching the correction film 138. If the thickness of the correction film 138 in the CD error region B of the photomask is decreased to be smaller than the thickness of the correction film 135 in the normal CD region A of the photomask, as illustrated in FIG. 5B, the intensity of the aerial image is increased such that the CD of the circuit patterns corresponding to the CD error region B of the photomask to be formed on the wafer is decreased. Similarly, the amount of correction is calculated when the CD of the circuit patterns is measured and the amount of etching the light transmission pattern (the correction film) 135 is determined based on the amount of correction so that the CD of the circuit patterns can be corrected.

However, referring to FIG. 6F, if the correction film 138 is a silicon oxide film, both the correction film 138 is etched and the transparent quartz substrate 110, which may be made of the same material as that of the correction film 138, may be etched by a thickness. Reference numeral 160 represents a case in which the quartz substrate 110 is etched during etching of the correction film 137. Due to etching of the substrate 110, the contrast of the circuit patterns may be improved but deformation of the CD may occur.

Figure 7A:
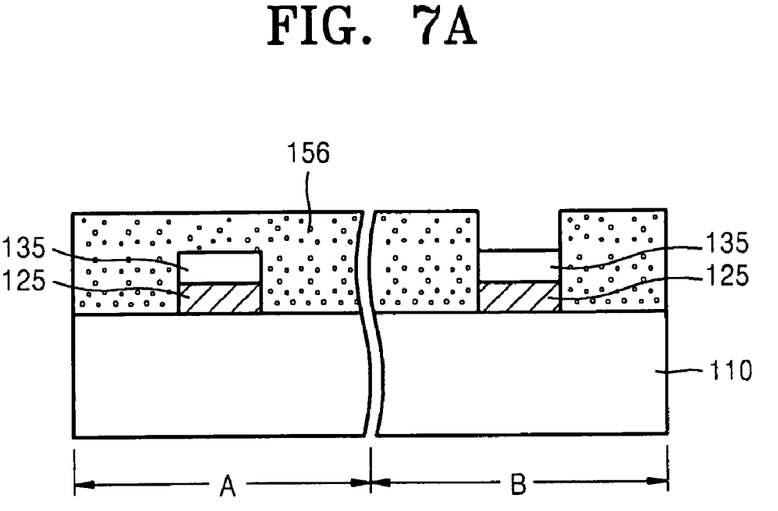
FIGS. 7A and 7B are cross-sectional views illustrating another example embodiment of a method of correcting a CD in a photomask by which substrate etching can be prevented.

In still further example embodiments, such as the example embodiment illustrated in FIG. 7A, the resist pattern 156 is formed so that only the shielding pattern 125 in the CD error region B of the photomask are exposed instead of both the shielding pattern 125 and the substrate 110 of the CD error region of the photomask being exposed.

Figure 7B:
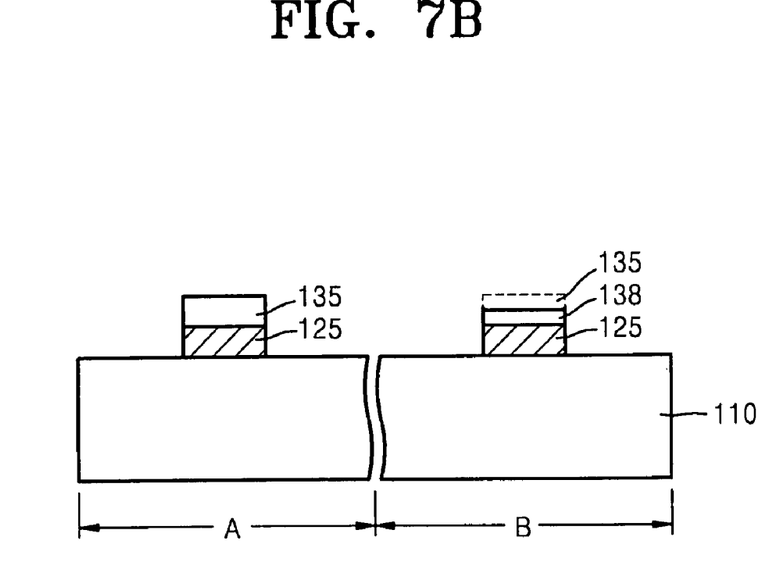

As illustrated in FIG. 7B, the correction film 135 on the exposed shielding pattern 125 of the CD error region B of the photomask is etched by a desired and/or predetermined thickness and then, the resist pattern 156 is removed. As such, according to the example embodiment in FIG. 7B, the correction film 138 may be etched without the loss of the quartz substrate 110. Further, the CD of only a desired and/or predetermined shielding pattern 125 can be individually corrected according the example embodiment shown in FIG. 7B.

According to still another example embodiment, a correction film 130 may be formed on the entire surface including the substrate 100 of both the normal CD region A of the photomask and the CD error region B of the photomask.

Figure 8A:
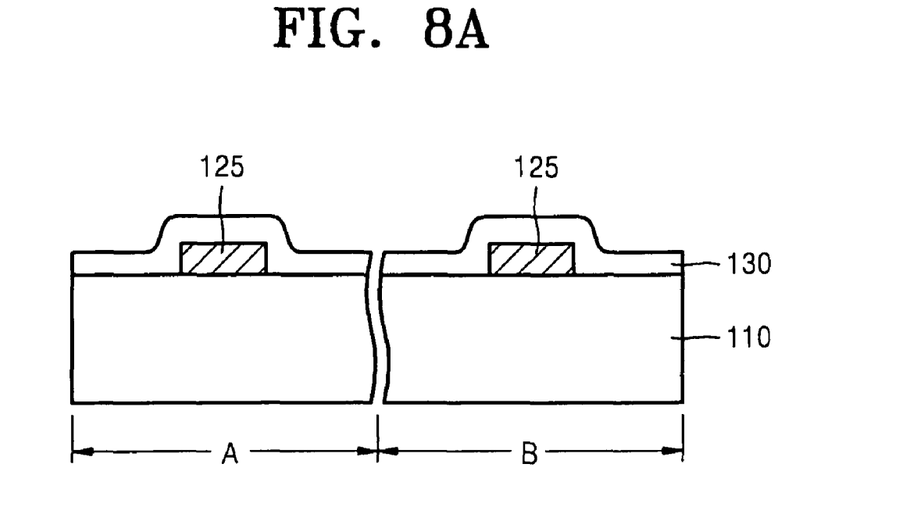
FIGS. 8A through 8D are cross-sectional views illustrating another example embodiment of a method of correcting a CD in a photomask.

That is, as illustrated in FIG. 8A, the shielding pattern 125 is formed on the photomask substrate 110. The shielding pattern 125 may be formed by the technique described in the above-described embodiment or a process of patterning the shielding film. After that, the correction film 130 for correcting the intensity of the incident light is formed on the entire surface of the mask substrate 110.

After circuit patterns (or photoresist patterns for defining the circuit patterns) are formed on a wafer using the photomask in which the correction film 130 is formed, CD measurement is performed on the circuit patterns. The CD error region B is detected and the amount of CD correction is determined based on the CD measurement values of the circuit patterns.

Figure 8B:
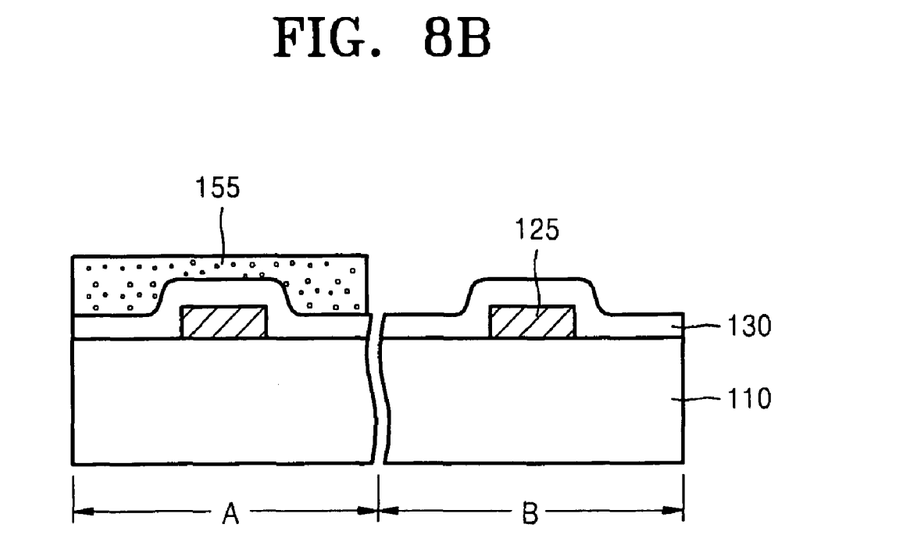

Referring to FIG. 8B, the resist pattern 155 may be formed on the normal CD region A so that the CD error region B can be exposed.

Figure 8C:
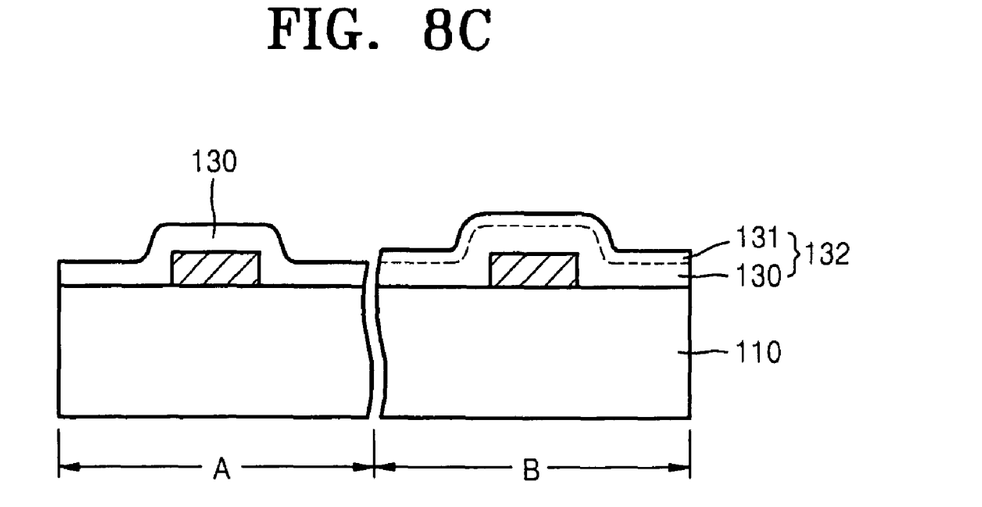

If CDs of circuit patterns (not shown) formed in the CD error region B are smaller than CDs of circuit patterns formed in the normal CD region A, a correction film 131 is additionally deposited on the exposed CD error region B such that the thickness of the entire correction film 132 including the correction films 131 and 130 in the CD error region B is increased to be larger than the thickness of the correction film 130 in the normal CD region A, as illustrated in FIG. 8C. Once the thickness of the entire correction film 132 is correct, the resist pattern 155 on the normal CD region A may be removed. As such, in this example, the intensity of the aerial image in the CD error region B is decreased such that the CDs of the circuit patterns in the CD error region B is increased. Thus, the CDs of the circuit patterns in all regions of the wafer are substantially uniform according to an example embodiment.

Figure 8D:
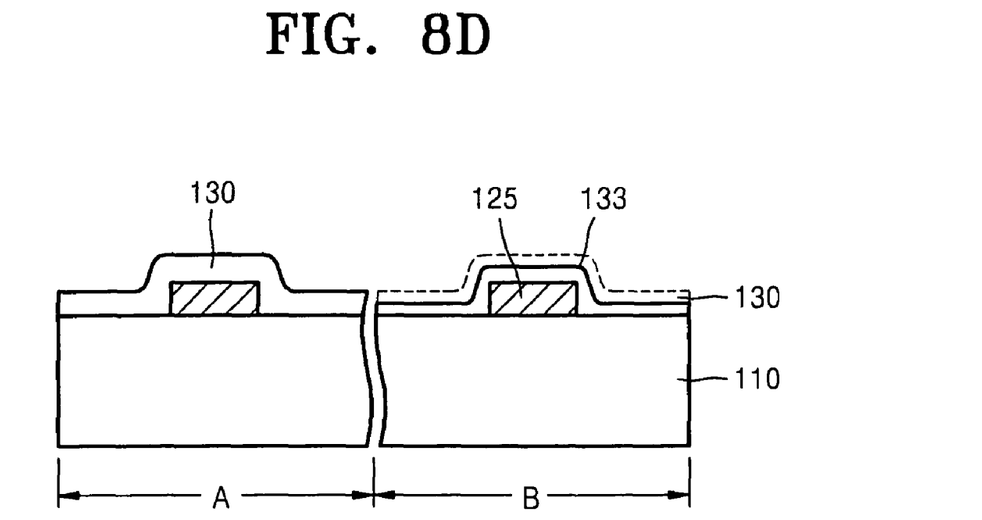

Conversely, if the CDs of the circuit patterns (not shown) formed in the CD error region B of the wafer is larger than the CD of circuit patterns (not shown) formed in the normal CD region A of the wafer, the correction film 130 in the CD error region B of the photomask may be etched by a desired and/or predetermined thickness such that the correction film 133 is formed to have a smaller thickness in the CD error region B of the photomask than in the normal CD region A of the photomask, as illustrated in FIG. 8D. In this case, the thickness of etching the correction film 130 is determined by a difference between line widths of the normal circuit pattern CD on the wafer and the defective circuit pattern CD of the wafer.

Even though the correction film 132 and 133 are formed on the entire surface of the photomask substrate 110, the intensity of the aerial image may be changed in a pattern shape. In addition, a three-dimensional (3D) topology is provided to the surface of the correction film 131 by the thickness of the shielding pattern 125 such that an image contrast may be improved according to an example embodiment.

Figure 9:
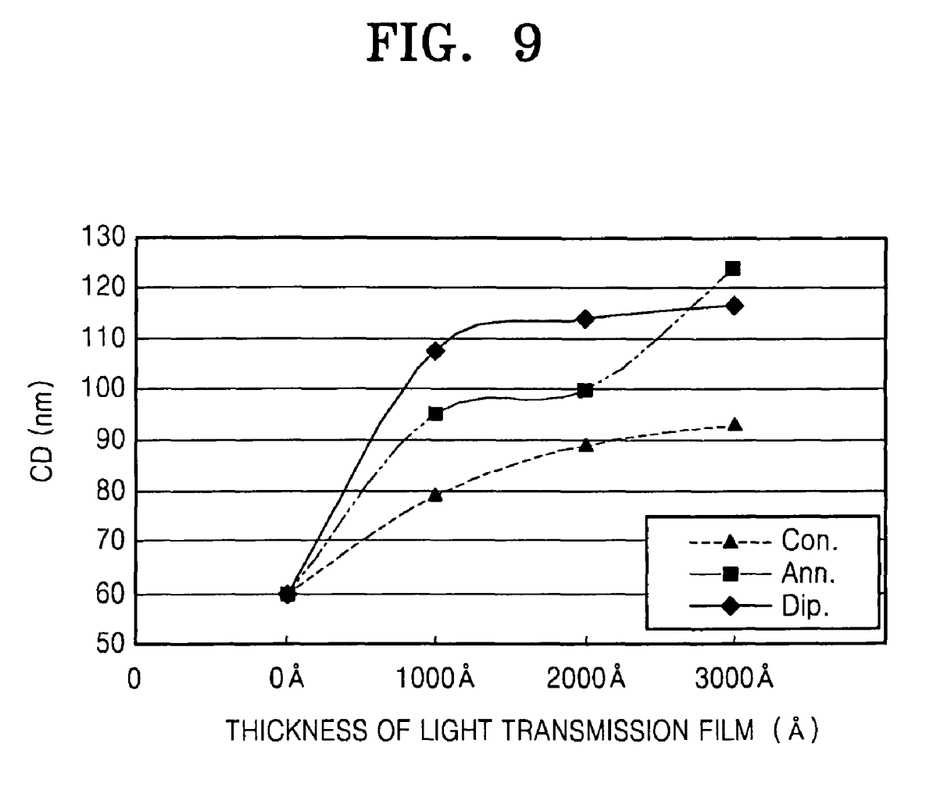
FIG. 9 is a graph of a variation in CDs of circuit patterns versus the thickness of a correction film according to the types of apertures according to an example embodiment.

FIG. 9 is a graph of a variation in CD of circuit patterns versus the thickness of a correction film according to the types of apertures. In FIG. 9, a variation in CD of the circuit patterns is shown when the correction film is formed on a photomask in which the CD of shielding patterns are set to 60 nm and an interval between the shielding patterns is set to 260 nm. Referring to FIG. 9, if a conventional aperture, an annular aperture and a bipolar aperture are used, the CD of the circuit patterns are increased in proportion to the thickness of a correction film. Thus, the CD of the circuit patterns can be adjusted and corrected according to the thickness of the correction films regardless of the types of apertures according to example embodiments.

As described above, according to example embodiments, a correction film is formed on a shielding pattern in a photomask and the thickness of the correction film is adjusted such that circuit patterns on a wafer, that is, CDs of photoresist patterns, are corrected.

Because the photoresist pattern CDs can be corrected only by depositing the correction film according to example embodiments, the process is relatively simple and etching of the photomask may be reduced and/or prevented and thus, damages caused by etching of the photomask may be reduced and/or prevented. In addition, according to example embodiments, the CD of the photoresist patterns can be precisely adjusted by adjusting the thickness of the correction film on a photomask.

Furthermore, according to example embodiments, only those regions requiring correction (e.g., CD error regions), are corrected.

While various example embodiments have been particularly shown and described in this disclosure, it will be understood by those of ordinary skill in the art that various changes in form and details may be made therein without departing from the spirit and scope of this disclosure.

What is claimed is:

1. A method of correcting a critical dimension (CD) in a photomask, the method comprising:
   providing a substrate that is transparent with respect to an incident light;
   forming a plurality of shielding patterns on the substrate to form the photomask;
   detecting a CD error region of the shielding patterns; and
   forming a correction film on the shielding patterns of the CD error region to vary an intensity of the incident light in the CD error region of the shielding patterns in order to correct non-uniformity of critical dimensions (CDs) of circuit patterns formed on a wafer using the shielding patterns;
   wherein a topology of the correction film on the shielding patterns of the CD error region changes the incident light transmitted through the photomask to decrease the intensity of $0^{th}$-order light and to increase the intensity of $1^{st}$-order light.

2. The method of claim 1, wherein the correction film is formed to a substantially uniform thickness on the entire surface of the CD error region.

3. The method of claim 1, wherein the correction film has substantially the same line width as that of each shielding pattern.

4. The method of claim 1, wherein the substrate is a quartz substrate.

5. The method of claim 1, wherein the correction film has a light absorption rate that is equal to or less than about 0.3.

6. The method of claim 1, wherein the correction film is a silicon oxide film.

7. The method of claim 1, wherein the correction film is a silicon nitride film.

8. The method of claim 1, wherein an amount of CD correction is determined according to a thickness of the correction film.

9. The method of claim 1, wherein a thickness of the correction film is less than 8000 Å.

10. The method of claim 1, wherein detecting the CD error region comprises:
    forming the circuit patterns on the wafer using the shielding patterns;
    measuring CDs of the circuit patterns; and
    determining that a region of the photomask is a CD error region if the CDs of the circuit patterns formed from the region of the photomask deviate outside of a range for uniformity of CDs of the circuit patterns.

11. The method of claim 10, wherein the range includes an average of the measured CDs of the circuit patterns.

12. The method of claim 10, wherein the range is centered about an average of the measured CDs of the circuit patterns.

13. The method of claim 10, wherein the circuit patterns are photoresist patterns.

14. The method of claim 1, wherein the correction film is a film that is transparent with respect to the incident light.

15. The method of claim 14, wherein the correction film has a light absorption rate that is equal to or less than about 0.3.

16. The method of claim 14, wherein the correction film is one of a silicon oxide film and a silicon nitride film.

17. The method of claim 14, wherein an amount of CD correction is determined according to a thickness of the correction film.

18. The method of claim 1, wherein forming the correction film includes depositing the correction film at least on the shielding patterns in the CD error region, and
adjusting the thickness of the correction film in the CD error region.

19. The method of claim 18, wherein adjusting the thickness of the correction film in the CD error region includes depositing an additional correction film on the correction film in the CD error region to increase the CDs of circuit patterns formed from the shielding patterns in the CD error region.

20. The method of claim 19, wherein depositing the additional correction film includes:
forming a resist pattern so the CD error region is exposed;
forming the additional correction film on the correction film in the exposed CD error region; and
removing the resist pattern.

21. The method of claim 18, wherein the adjusting the thickness of the correction film in the CD error region includes etching the correction film in the CD error region to decrease the CD of the circuit patterns in the CD error region.

22. The method of claim 21, wherein the etching of the correction film includes:
forming a resist pattern so that the shielding patterns in the CD error region are exposed;
selectively etching the correction film in the exposed CD error region; and
removing the resist pattern.

23. The method of claim 1, further comprising:
adjusting a thickness of the correction film in the CD error region;
wherein forming the plurality of shielding patterns and forming the correction film are sequentially performed to form a photomask that includes a shielding film, a correction film, and a dummy shielding film on the transparent substrate.

24. The method of claim 23, further comprising:
etching a portion of each of the dummy shielding film and the correction film; and
etching the shielding film by using the dummy shielding film as an etching mask to form the plurality of shielding patterns and a correction film pattern, and
removing the dummy shielding film.

* * * * *